US011615857B2

United States Patent
La Rosa et al.

(10) Patent No.: US 11,615,857 B2
(45) Date of Patent: Mar. 28, 2023

(54) METHOD FOR WRITING IN A NON-VOLATILE MEMORY ACCORDING TO THE AGEING OF THE MEMORY CELLS AND CORRESPONDING INTEGRATED CIRCUIT

(71) Applicants: STMicroelectronics S.r.l., Agrate Brianza (IT); STMicroelectronics (Rousset) SAS, Rousset (FR)

(72) Inventors: Francesco La Rosa, Rousset (FR); Enrico Castaldo, Catania (IT); Francesca Grande, Syracuse (IT); Santi Nunzio Antonino Pagano, Catania (IT); Giuseppe Nastasi, San Filippo del Mela (IT); Franco Italiano, San Filippo del Mela (IT)

(73) Assignees: STMICROELECTRONICS S.r.l., Agrate Brianza (IT); STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 17/224,024

(22) Filed: Apr. 6, 2021

(65) Prior Publication Data

US 2021/0319836 A1  Oct. 14, 2021

(30) Foreign Application Priority Data

Apr. 14, 2020  (FR) ..................................... 2003730

(51) Int. Cl.
*G11C 16/00*  (2006.01)
*G11C 16/34*  (2006.01)
(Continued)

(52) U.S. Cl.
CPC ............ *G11C 16/349* (2013.01); *G11C 16/10* (2013.01); *G11C 16/14* (2013.01); *G11C 16/26* (2013.01);
(Continued)

(58) Field of Classification Search
CPC .......... H01L 27/11558; H01L 29/7883; H01L 27/11521; H01L 27/11524;
(Continued)

(56) References Cited

U.S. PATENT DOCUMENTS 7,050,335 B2  5/2006 Leconte et al.
7,612,397 B2 * 11/2009 Ueda ................. H01L 27/11558
257/532
(Continued)

FOREIGN PATENT DOCUMENTS

EP  1 486 987 A1  12/2004

*Primary Examiner* — Thong Q Le
(74) *Attorney, Agent, or Firm* — Seed Intellectual Property Law Group LLP

(57) ABSTRACT

A semiconductor well of a non-volatile memory houses memory cells. The memory cells each have a floating gate and a control gate. Erasing of the memory cells includes biasing the semiconductor well with a first erase voltage having an absolute value greater than a breakdown voltage level of bipolar junctions of a control gate switching circuit of the memory. An absolute value of the first erase voltage is based on a comparison of a value of an indication of wear of the memory cells to a wear threshold value.

27 Claims, 4 Drawing Sheets

(51) Int. Cl.
  *G11C 16/10* (2006.01)
  *G11C 16/14* (2006.01)
  *G11C 16/26* (2006.01)
  *H01L 27/11529* (2017.01)
  *G11C 16/04* (2006.01)

(52) U.S. Cl.
  CPC .... *H01L 27/11529* (2013.01); *G11C 16/0483* (2013.01)

(58) Field of Classification Search
  CPC ............ H01L 27/11519; H01L 27/115; H01L 23/528; H01L 29/66825; H01L 27/11517; H01L 28/40; H01L 29/42324; H01L 29/7885; H01L 29/861; H01L 27/11529; H01L 29/40114; H01L 29/42328; H01L 27/0629; H01L 27/11568; H01L 29/0642; H01L 29/7881; H01L 29/8611; H01L 2924/00; H01L 2924/0002; H01L 2924/1443; H01L 27/1156; H01L 28/00; H01L 29/0688; H01L 29/1095; H01L 29/66833; H01L 29/7887; H01L 29/792; H01L 21/823892; H01L 27/11526; H01L 27/11531; H01L 27/11534; H01L 27/11541; H01L 27/11548; H01L 27/11551; H01L 27/11573; H01L 27/2463; H01L 29/66136; H01L 29/788; G11C 2216/10; G11C 16/0433; G11C 16/10; G11C 16/26; G11C 16/0408; G11C 16/14; G11C 16/0416; G11C 16/0441; G11C 16/06; G11C 16/12; G11C 16/045; G11C 16/0483; G11C 16/16; G11C 16/18; G11C 16/08; G11C 16/24
  USPC ............ 365/185.28, 185.24, 185.29, 185.18, 365/185.33; 257/315, 314, E27.103, 300, 257/E21.694, 316, 321, 323, 324, 409, 257/E29.304, 318, 319, 320, 322, 390, 257/391, E21.423, E21.679, E21.691, 257/E29.306, 29.309; 438/241, 257, 258, 438/261, 267, 283, 381, 585
  See application file for complete search history.

(56) References Cited

U.S. PATENT DOCUMENTS

2014/0097481 A1    4/2014  La Rosa et al.
2019/0371410 A1   12/2019  Song et al.

* cited by examiner

|  | BL | WL | CGL | NISO | PW1 |
|---|---|---|---|---|---|
| sel | HZ | 5V-7V | -VNN | +VYP | +VYP |
| nsel |  |  | +VPP |  |  |

METHOD FOR WRITING IN A NON-VOLATILE MEMORY ACCORDING TO THE AGEING OF THE MEMORY CELLS AND CORRESPONDING INTEGRATED CIRCUIT

BACKGROUND

Technical Field

The embodiments and implementations relate to integrated circuits, in particular non-volatile memories and writing in non-volatile memories.

Description of the Related Art

Writing in non-volatile memories, for example of the electrically erasable and programmable type, "EEPROM" (Electrically Erasable Programmable Read-Only Memory) generally comprises an erase cycle followed by a programming cycle. For example, the erase cycle is collective in the so-called selected memory cells belonging to a so-called selected full page (or line), whereas programming is selective according to the data to be written ("0" or "1") in the different memory cells of the selected memory. During erase and programming cycles, floating-gate transistors belonging to each memory cell are biased with sufficiently high write voltages to cause an injection of charges (positive or negative charges depending on the erasure and programming convention employed) by Fowler-Nordheim effect, or by the effect of injecting hot carriers, into the floating gate of the transistor.

Thus, the threshold value (the value of the threshold voltage) of the floating-gate transistor in the erased state is different from the threshold value of the floating-gate transistor in the programmed state, which allows the data stored to be read.

The write voltages are in the order of 10 to 15 volts in absolute value form and are applied, for example during erasure, between the control gate and the body of the floating-gate transistor (the substrate or well housing the transistor) or, for example during programming, between the control gate and a conducting terminal of the floating-gate transistor.

Split voltage techniques provide, in order to generate high write voltages, for applying, on the one hand, a positive voltage of moderate amplitude and on the other hand a negative voltage of moderate amplitude.

This in particular allows the size of the transistors of the memory to be reduced, in particular of the transistors conveying the write voltages, given that the voltage restrictions in these transistors are moderated by the split voltage techniques.

After numerous erase and programming cycles, the charge injections tend to degrade in particular the dielectric layers through which the injected charges pass by tunnel effect.

This degradation results in a drift in the threshold value of the transistor in the erased state and in the programmed state.

This drift is particularly high in erasures comprising charges injected between the semiconductor body and the floating gate. For example, after a few hundred thousand write cycles, for example 500,000 cycles, the threshold value in the erased state can be in the order of 2 to 4 volts greater than the threshold value in the erased state resulting from the first erase cycles.

Thus, the distinction between an erased state and a programmed state can become uncertain after a large number of write cycles.

This ageing phenomenon results in limiting the durability of the memory. Memory durability is a property that defines the number of write cycles for which normal operation of the memory is guaranteed, in other words the "life" of the memory. Durability is an important property from a commercial standpoint.

This ageing phenomenon is all the more pronounced as the size of the transistors in the memory is reduced.

Moreover, techniques providing for increasing the life of the erase cycles to limit the drift in the threshold values in the erased state have the instant drawback of slowing write operations. The speed of a write cycle is also an important property from a commercial standpoint.

Therefore, conventional techniques providing for increasing the erase voltage to limit the drift in the threshold values are typically limited by the breakdown levels of the junctions of the transistors conveying the control gate voltages.

BRIEF SUMMARY

Thus, there is a need to propose compact non-volatile memories having a longer durability, yet without limiting the memory's other properties.

According to one aspect, the disclosure proposes a method for writing in a non-volatile memory including memory cells housed in a semiconductor well, each including a state transistor having a floating gate and a control gate. The method comprises an erase cycle comprising biasing the semiconductor well with a first erase voltage, that is for example positive, and, in response to an increase in a wear value of the memory cells greater than a wear threshold value, increasing the level of the first erase voltage, in absolute value form, to a level that is greater than a breakdown level of bipolar junctions of a control gate switching circuit of the memory.

In the method according to this aspect, the erase cycle can comprise biasing the control gates of the selected memory cells with a second erase voltage, that is for example negative, by way of the control gate switching circuit.

It goes without saying that the wear value of the memory cells is a value that represents the ageing of the memory cells, which may be determined at a given moment in time by circuits provided for this purpose. For example, the number of erase cycles performed may be counted and the count may serve as an indication of wear of the memory cells; a different between a stored voltage level of a memory cell and a threshold voltage level may serve as an indication of wear; etc.; and combinations thereof.

The wear threshold value can be the value that represents the ageing of the memory cells from which the maximum voltage level in the control gate switching circuit (the breakdown level of the bipolar junctions) is no longer sufficient to prevent a drift in the threshold value of the state transistors in the erased state (for example a drift in the order of 2 volts). Such an ageing of the memory cells, corresponding to the wear threshold value, can for example be shown by 500,000 write cycles implemented in the memory.

The first erase voltage and the second erase voltage are mutually configured so as to erase the selected memory cells, for example by injecting a charge into the floating gate of the state transistors of the selected memory cells, conventionally by Fowler-Nordheim effect.

In other words, the method according to this aspect proposes, in a split voltage technique, increasing the amplitude of the erase voltage by increasing, in absolute value form, the component of the erase voltage applied in the well of the memory cells, the first erase voltage.

However, the first erase voltage does not pass through the control gate switching circuit.

Thus, the level of the first erase voltage is not limited by the breakdown level of the bipolar junctions of the control gate switching circuit.

This thus allows the drift in the threshold values to be limited, while intensifying erasures in the aged memory cells beyond the limit imposed by the breakdown of the bipolar junctions of the control gate switching circuit, and thus allows the overall durability of the memory to be increased.

The memory can include a peripheral circuit, buffer transistors housed in a buffer semiconductor well, the memory cells being coupled to the peripheral circuit by way of conducting terminals of the buffer transistors, and, according to one implementation, the buffer semiconductor well and the gates of the buffer transistors are biased with a buffer isolation voltage adapted so as to isolate the peripheral circuit from the first erase voltage.

For example, bit lines are coupled to conducting terminals of the state transistors of the memory cells, and the bit lines are coupled to the peripheral circuit by way of the conducting terminals of the buffer transistors.

This allows, when the level of the first erase voltage is greater than the breakdown level of the control gate switching circuit, the first erase voltage not to be transmitted to the peripheral circuit, voltages greater than the breakdown level of the control gate switching circuit generally being destructive for the peripheral circuit.

More specifically, since the bit lines are not used during the erase cycle, they are at a floating potential. Thus, the potential of the bit lines can rise to the level of the first erase voltage, potentially to a voltage level capable of degrading the peripheral circuit.

However, since the gates of the buffer transistors are biased with the buffer isolation voltage, the peripheral circuit is protected from the first erase voltage present across the bit lines during writing. Furthermore, since the buffer semiconductor well is also biased with the buffer isolation voltage, the buffer transistors will not be damaged by the first erase voltage of the bit lines.

In this respect, when the wear value is greater than the wear threshold value, the buffer isolation voltage can be at least equal to the difference between the level of the first erase voltage and the breakdown level of the bipolar junctions of the control gate switching circuit.

According to one implementation, a semiconductor isolation region is biased with the first erase voltage, the conductor isolation region surrounding the semiconductor well housing the memory cells and the buffer semiconductor well, in structures of the triple-well type.

On the one hand, it allows the semiconductor regions of the memory to be electrically isolated from the first erase voltage. More specifically, the bipolar junctions between the substrate and the semiconductor isolation region are generally capable of supporting voltages greater than said breakdown voltage of the control gate switching circuit.

On the other hand, the semiconductor isolation region shared by the structures of the triple well type both for the well housing the memory cells and for the buffer well, is advantageously compact. This sharing is in particular procured through the buffer isolation voltage, preventing breakdown of the bipolar junction between the buffer semiconductor well and the semiconductor isolation region biased with the first erase voltage.

According to one implementation, the erase cycle further comprises, via the control gate switching circuit, biasing the control gates of the unselected memory cells with a neutralization voltage.

The neutralization voltage is configured relative to the first erase voltage, applied in the well also housing the unselected memory cells, so as to neutralize spurious erasure phenomena of the unselected memory cells. This is advantageous in terms of data retention.

For example, the neutralization voltage is chosen such that it is equal to the first erase voltage. The neutralization voltage is nonetheless limited by the breakdown level of the bipolar junctions of the control gate switching circuit.

According to one implementation, when the wear value is less than the wear threshold value, the method comprises increasing the level of the neutralization voltage, in absolute value form, so as to keep a constant initial deviation relative to said level of the first erase voltage. In the case where the neutralization voltage is chosen such that it is equal to the first erase voltage, the initial deviation maintained constant is a zero deviation.

This advantageously allows spurious erasure phenomena of the unselected memory cells to be neutralized, whereas the first erase voltage increases in line with the ageing of the memory cells.

According to one implementation, when the wear value is greater than the wear threshold value, the method comprises offsetting the level of the neutralization voltage to an offset neutralization voltage level, and increasing the level of the offset neutralization voltage, in absolute value form, so as to keep the offset constant relative to said level of the first erase voltage.

Moreover, advantageously, when the wear value is greater than the wear threshold value, the level of the first erase voltage remains unchanged, when the level of the neutralization voltage reaches said breakdown level of the bipolar junctions of the control gate switching circuit.

In other words, when the first erase voltage exceeds the breakdown voltage of the control gate switching circuit, the level of the neutralization voltage is offset so as not to exceed the level of the breakdown voltage. The neutralization voltage then follows the evolution of the first erase voltage without exceeding the breakdown voltage, as a result of the offset. When the neutralization voltage reaches, to the nearest safety margin, the level of the breakdown voltage of the bipolar junctions of the control gate switching circuit, the first erase voltage is no longer increased.

Keeping a constant offset when increasing the first erase voltage, beyond the wear threshold value, is advantageous in terms of regulating the voltages generated, and allows spurious erasure phenomena caused by this constant difference to be well controlled. In this respect, the method can provide for compensating for the spurious erasures by conventional mechanisms, for example so-called "refresh" algorithms.

According to another implementation, when the wear value is greater than the wear threshold value, the level of the first erase voltage remains unchanged, at a level equal to a tolerance margin taken for said breakdown level of the bipolar junctions of the control gate switching circuit.

In this other implementation, the level of the neutralization voltage is not offset and remains constant beyond the wear threshold value. Thus, the deviation between the level of the first erase voltage and the level of the neutralization voltage increases in line with the evolution of the level of the first erase voltage. As a result, the spurious erasure phenomena in the unselected memory cells are potentially less well controlled, but are lower at the start than at the end of the period beginning after the wear threshold value.

According to another aspect, the disclosure proposes a non-volatile memory integrated circuit comprising:

memory cells housed in a semiconductor well and each including a state transistor having a floating gate and a control gate; and erasure means configured, during an erase cycle, so as to bias the semiconductor well with a first erase voltage, that is for example positive, the erasure means being configured, in response to an increase in a wear value of the memory cells greater than a wear threshold value, to increase the level of the first erase voltage, in absolute value form, to a level that is greater than a breakdown level of the bipolar junctions of a control gate switching circuit.

According to one embodiment, the erasure means are configured, during the erase cycle, so as to bias the control gates of the selected memory cells with a second erase voltage, that is for example negative, by way of the control gate switching circuit.

According to one embodiment, the integrated circuit further includes a peripheral circuit, buffer transistors housed in a buffer semiconductor well, and the memory cells are coupled to the peripheral circuit by way of conducting terminals of the buffer transistors, the buffer semiconductor well and the gates of the buffer transistors being intended to be biased with a buffer isolation voltage adapted so as to isolate the peripheral circuit from the first erase voltage.

According to one embodiment, when the wear value is greater than the wear threshold value, a distribution circuit is configured so as to generate the buffer isolation voltage at least equal to the difference between the level of the first erase voltage and the breakdown level of the bipolar junctions of the control gate switching circuit.

According to one embodiment, the semiconductor well housing the memory cells is surrounded by a semiconductor isolation region in a structure of the triple well type, and the buffer semiconductor well is also surrounded by the same semiconductor isolation region, in a structure of the triple well type, the semiconductor isolation region being intended to be biased with the first erase voltage.

According to one embodiment, the erasure means are further configured, during an erase cycle, so as to bias the control gates of the unselected memory cells with a neutralization voltage, by way of the control gate switching circuit.

According to one embodiment, when the wear value is less than the wear threshold value, the erasure means are configured so as to increase the level of the neutralization voltage, in absolute value form, so as to keep a constant initial deviation relative to said level of the first erase voltage.

According to one embodiment, when the wear value is greater than the wear threshold value, the erasure means are configured so as to offset the level of the neutralization voltage to an offset neutralization voltage level, and to increase the level of the offset neutralization voltage, in absolute value form, so as to keep the offset constant relative to said level of the first erase voltage.

According to one embodiment, when the wear value is greater than the wear threshold value, the erasure means are configured so as to keep the level of the first erase voltage unchanged, when the level of the neutralization voltage reaches said breakdown level of the bipolar junctions of the control gate switching circuit.

According to one embodiment, when the wear value is greater than the wear threshold value, the erasure means are configured so as to keep the level of the first erase voltage unchanged, when the level of the first erase voltage is equal to a tolerance margin taken for said breakdown level of the bipolar junctions of the control gate switching circuit.

In an embodiment, a method comprises: erasing memory cells housed in a semiconductor well of a non-volatile memory, the memory cells each having a floating gate and a control gate, the erasing including biasing the semiconductor well with a first erase voltage having an absolute value greater than a breakdown voltage level of bipolar junctions of a control gate switching circuit of the memory, an absolute value of the first erase voltage being based on a comparison of a value of an indication of wear of the memory cells to a wear threshold value; and writing to one or more of the memory cells. In an embodiment, the absolute value of the erase voltage is increased in response to the comparison indicating the value of the indication of wear is greater than the wear threshold value. In an embodiment, the erasing comprises biasing the control gates of selected memory cells with a second erase voltage, using the control gate switching circuit. In an embodiment, the memory includes a peripheral circuit, and buffer transistors housed in a buffer semiconductor well; the memory cells are coupled to the peripheral circuit by conducting terminals of the buffer transistors; and the buffer semiconductor well and the gates of the buffer transistors are biased with a buffer isolation voltage to isolate the peripheral circuit from the first erase voltage. In an embodiment, when the value of the indication of wear is less than the wear threshold value, the buffer isolation voltage is at least equal to a difference between the level of the first erase voltage and the breakdown voltage level of the bipolar junctions of the control gate switching circuit. In an embodiment, a semiconductor isolation region is biased with the first erase voltage, the semiconductor isolation region surrounding the semiconductor well housing the memory cells and the buffer semiconductor well, the memory having a structure of a triple-well type. In an embodiment, the erase cycle comprises, via the control gate switching circuit, biasing the control gates of unselected memory cells with a neutralization voltage. In an embodiment, when the value of the indication of wear is less than the wear threshold value, the method comprises increasing the level of the neutralization voltage, in absolute value form, so as to keep a constant initial deviation relative to the level of the first erase voltage. In an embodiment, when the value of the indication of wear is greater than the wear threshold value, the method comprises offsetting the level of the neutralization voltage to an offset neutralization voltage level, and increasing the level of the offset neutralization voltage, in absolute value form, so as to keep the offset constant relative to the level of the first erase voltage. In an embodiment, when the value of the indication of wear is greater than the wear threshold value, the level of the first erase voltage remains unchanged after the level of the neutralization voltage reaches the breakdown voltage level of the bipolar junctions of the control gate switching circuit. In an embodiment, when the value of the indication of wear is greater than the wear threshold value, the level of the first erase voltage remains unchanged, at a level equal to a tolerance margin taken for the breakdown voltage level of the bipolar junctions of the control gate switching circuit.

In an embodiment, a non-volatile memory integrated circuit comprises: memory cells housed in a semiconductor well, each memory cell including a state transistor having a floating gate and a control gate; and control circuitry, which, in operation controls reading, writing and erasing of the memory cells, wherein the erasing includes biasing the semiconductor well with a first erase voltage having an absolute value greater than a breakdown voltage level of bipolar junctions of a control gate switching circuit of the non-volatile memory, an absolute value of the first erase voltage being based on a comparison of a value of an indication of wear of the memory cells to a wear threshold value. In an embodiment, the absolute value of the erase voltage is increased in response to the comparison indicating the value of the indication of wear is greater than the wear threshold value. In an embodiment, the control circuitry, in operation, biases the control gates of selected memory cells with a second erase voltage, using the control gate switching circuit. In an embodiment, the integrated circuit includes a peripheral circuit and buffer transistors housed in a buffer semiconductor well, wherein the memory cells are coupled to the peripheral circuit by conducting terminals of the buffer transistors, and the control circuitry, in operation, biases the buffer semiconductor well and the gates of the buffer transistors with a buffer isolation voltage to isolate the peripheral circuit from the first erase voltage. In an embodiment, in operation, when the value of the indication of wear is greater than the wear threshold value, the control circuitry generates the buffer isolation voltage at least equal to a difference between a level of the first erase voltage and the breakdown voltage level of the bipolar junctions of the control gate switching circuit. In an embodiment, the semiconductor well housing the memory cells is surrounded by a semiconductor isolation region in a structure of triple well type, the buffer semiconductor well is surrounded by the semiconductor isolation region, and the control circuitry, in operation, biases the semiconductor isolation region with the first erase voltage. In an embodiment, the control circuitry, during an erase cycle, biases control gates of unselected memory cells with a neutralization voltage, via the control gate switching circuit. In an embodiment, during the erase cycle, when the value indicative of wear is less than the wear threshold value, the control circuitry sets a level of the neutralization voltage, in absolute value form, to keep a constant initial deviation relative to the level of the first erase voltage. In an embodiment, during the erase cycle, when the value indicative of wear is greater than the wear threshold value, the control circuitry, in operation, offsets the level of the neutralization voltage to an offset neutralization voltage level, and to increase the level of the offset neutralization voltage, in absolute value form, so as to keep the offset constant relative to the level of the first erase voltage. In an embodiment, when the value indicative of wear is greater than the wear threshold value, the control circuitry maintains the level of the first erase voltage unchanged, when the level of the neutralization voltage reaches the breakdown level of the bipolar junctions of the control gate switching circuit. In an embodiment, when the value indicative of wear is greater than the wear threshold value, the control circuitry maintains the level of the first erase voltage unchanged, when the level of the first erase voltage is equal to a tolerance margin taken for the breakdown level of the bipolar junctions of the control gate switching circuit.

In an embodiment, a system comprises: one or more processing cores; and a non-volatile memory coupled to the one or more processing cores, the non-volatile memory including: memory cells housed in a semiconductor well, each memory cell including a state transistor having a floating gate and a control gate; and control circuitry, which, in operation controls reading, writing and erasing of the memory cells, wherein the erasing includes biasing the semiconductor well with a first erase voltage having an absolute value greater than a breakdown voltage level of bipolar junctions of a control gate switching circuit of the non-volatile memory, an absolute value of the first erase voltage being based on a comparison of a value of an indication of wear of the memory cells to a wear threshold value. In an embodiment, the system comprises an integrated circuit including the non-volatile memory. In an embodiment, the integrated circuit includes the one or more processing cores. In an embodiment, the absolute value of the first erase voltage is increased in response to the comparison indicating the value of the indication of wear is greater than the wear threshold value.

BRIEF DESCRIPTION OF THE SEVERAL VIEWS OF THE DRAWINGS

Other advantages and features of the disclosure will become apparent upon examining the detailed description of non-limiting embodiments and of implementations, and from the accompanying drawings in which.

DETAILED DESCRIPTION

Figures 1, 2:
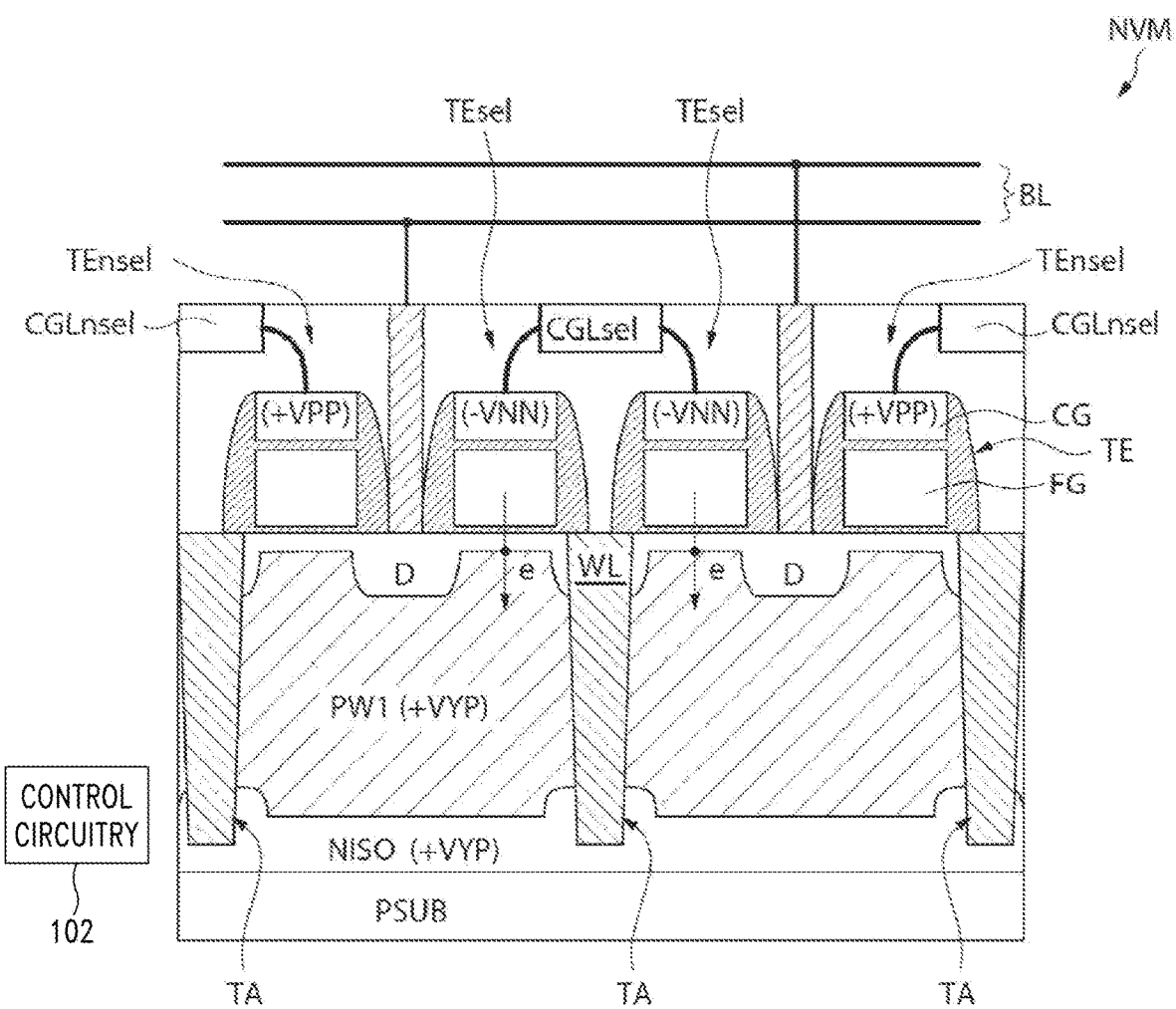
FIG. 1 shows a sectional view of one example of memory cells of an integrated circuit of a non-volatile memory NVM of an embodiment.
FIG. 2 shows one example embodiment of implementing an erase cycle of the memory NVM described with reference to FIG. 1.

FIG. 1 shows a sectional view of one example of memory cells of an integrated circuit of a non-volatile memory NVM. The integrated circuit as illustrated also includes control circuitry 102, which controls writing, reading and erasing of memory cells of the non-volatile memory NVM. In some embodiments, separate circuitry may be employed to control reading, writing and erasing of memory cells. The non-volatile memory may be included in a system comprising one or more processing cores, which may, for example, coupled to the non-volatile memory and may store data in and retrieve data from the non-volatile memory.

A memory cell includes a state transistor TE (either TEsel or TEnsel, depending on whether the state transistor TE is selected or respectively not selected) and an access transistor TA coupled in series.

The memory cells are housed in and on a semiconductor well PW1, typically of the P-doped type.

The well PW1 houses the memory cells in a memory array PM (See FIG. 6), typically arranged in an array of rows and of columns.

The state transistors TE (TEsel, TEnsel) include a floating gate FG and a control gate CG, the floating gate FG being electrically isolated from the well PW1 by a so-called "tunnel" dielectric layer, and electrically isolated from the control gate CG by a so-called "gate" dielectric layer.

In this example, the access transistor TA is a buried vertically-oriented gate transistor, and is shared by two state transistors TE (TEsel, TEnsel) on either side of the vertical gate. The vertical gate fills a trench etched vertically in the well PW1, the sides and bottom of the trench being covered in a gate dielectric layer.

The vertical gates of the access transistors TA moreover form a word line WL extending in the direction perpendicular to the plane in FIG. 1, common, for example, to a row of memory cells.

A buried semiconductor region NISO on the one hand allows the well PW1 housing the memory cells to be electrically isolated from the semiconductor substrate PSUB, and on the other hand allows the source region of the access transistors TA to be formed.

The well PW1 housing the memory cells is effectively isolated from the semiconductor substrate PSUB by the buried semiconductor region NISO and by isolation wells of the N-doped type laterally around the well PW1, according to a so-called "triple well" isolated well structure. This in particular allows the well PW1 to be biased with positive potentials.

The drains D of the access transistors TA are situated at the surface of the well PW1, and at the same time form the source regions of the respective state transistors TEsel. The drain regions of the state transistors TEsel, TEnsel are coupled via contacts to bit lines BL in the first levels of the interconnection part of the integrated circuit.

In order to record data in the memory, writing circuitry is configured so as to logically select the memory cells to be written, the memory cells not to be written being referred to as unselected.

Erasure circuitry is configured so as to collectively erase the memory cells belonging to at least one selected page, during an erase cycle. A page of the memory is a group of memory cells, typically an entire row of memory cells, in the matrix organization of the memory array.

Programming circuitry is configured so as to selectively program the memory cells, during an erase cycle. For example, a programming cycle comprises collectively biasing the control gate line CGLsel with a first programming voltage, and selectively biasing the bit lines BL, according to the data to be stored, with a second programming voltage.

Reference is now made to FIG. 2.

FIG. 2 shows one example of implementing an erase cycle of the memory NVM described hereinabove with reference to FIG. 1.

During the erase cycle, the erasure circuitry is configured so as to bias the semiconductor well PW1 with a first erase voltage VYP, and to bias the selected control gate lines CGLsel with a second erase voltage −VNN.

The remainder of the description hereinbelow will consider the usual convention wherein the first erase voltage VYP is positive, and wherein the second erase voltage VNN is negative. The first erase voltage VYP can thus be denoted as a "positive erase voltage" and the second erase voltage VNN can thus be denoted as a "negative erase voltage".

That said, the embodiments and implementations described hereinbelow could be adapted to voltages of opposite signs, and in particular in a well housing the memory cells of opposite conductivity (of the N type), by considering increases in the absolute values of the negative voltages.

The positive erase voltage VYP and the negative erase voltage −VNN are mutually configured so as to produce a charge "e" transfer from the floating gate of the state transistors TEsel of the selected memory cells to the well PW1, typically by Fowler-Nordheim effect, through the tunnel dielectric layer.

Moreover, during the erase cycle, the erasure circuitry is configured so as to bias the unselected control gate lines CGLnsel with a neutralization voltage +VPP, that is positive in this example.

The neutralization voltage +VPP neutralizes the spurious erasure phenomena in the unselected state transistors TEnsel, potentially caused by the positive erase voltage VYP applied in the well PW1 also housing the unselected memory cells. For example, the neutralization voltage +VPP may initially be chosen such that it is equal to the positive erase voltage VYP.

Moreover, the bit lines BL are left at a floating potential HZ; the access transistors TA are biased with substantially 5V or 7V (volts) on their vertical gates to limit the stress caused on their gate oxide by the positive erase voltage VYP in the well PW1; and the buried semiconductor isolation region NISO is biased with the positive erase voltage VYP.

Thus, the erase cycle in particular comprises biasing the selected control gate line CGLsel with a negative erase voltage −VNN, and biasing the unselected control gate lines CGLnsel with a positive neutralization voltage +VPP.

Figure 3:
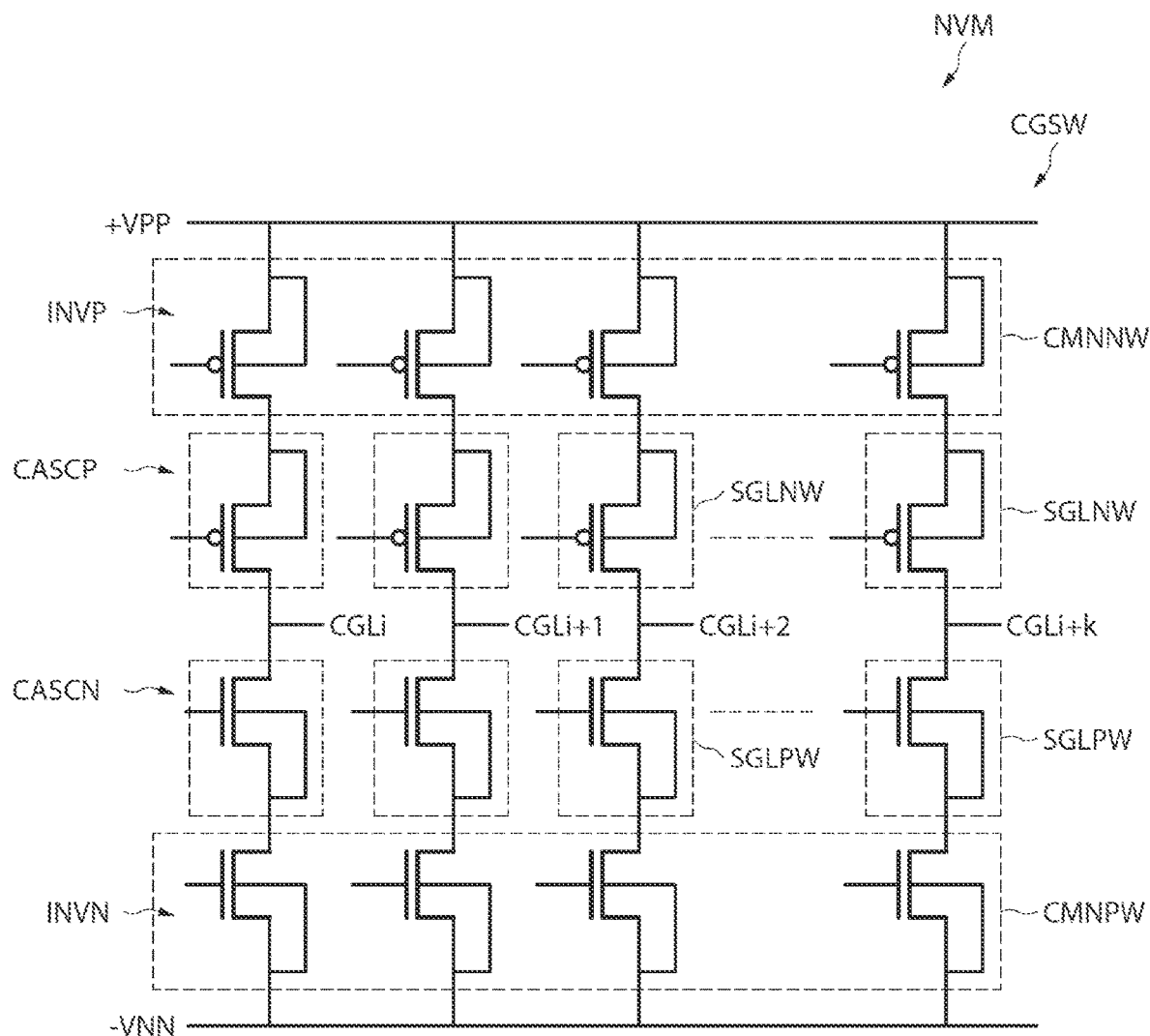
FIG. 3 shows an example of an embodiment of a control gate switching circuit GCSW used to transmit the negative erase voltage −VNN or the positive neutralization voltage +VPP in the control gate lines of the memory cells.

Reference is now made to FIG. 3.

FIG. 3 shows an example of a control gate switching circuit GCSW used to transmit the negative erase voltage −VNN or the positive neutralization voltage +VPP in the control gate lines CGLi, CGLi+1, CGLi+2, . . . , CLGi+k of the memory cells.

The control gate switch CGSW selectively transmits the negative erase voltage −VNN or the positive neutralization voltage +VPP depending on whether the memory cells of a page are selected or unselected for erasure. The control gate switch CGSW decodes, in this respect, a selection control signal by means of circuits of the inverter type, with complementary high-voltage metal oxide semiconductor HVMOS technology, well known to those skilled in the art.

Thus, PMOS transistors of the inverters INVP are formed in a common N-type semiconductor well CMNPW, and NMOS transistors of the inverters INVN are formed in a common p-type semiconductor well CMNPW. Moreover, PMOS and NMOS transistors of the cascode type CASP, CASCN can be provided on the CGLi–CGLi+k outputs of the inverters, and are formed in isolated wells SGLNW, SGLPW.

Thus, in the control gate switching circuit CGSW, the maximum of the potential difference (HVmax, FIGS. 4 and 5) between the positive neutralization voltage +VPP and the negative erase voltage −VNN is limited by the features of the HVMOS transistors (INVP, INVN, CASCP, CASCN). In particular, the bipolar junctions between the conducting regions (in particular the drain regions, since the wells are typically biased by the potentials of the source regions) of the HVMOS transistors and the respective wells are typically limited by the breakdown level (HVmax) thereof, for example substantially to 11V.

As a result, in order to intensify the erase stimuli, the voltage conditions of the erase cycles, the level of the voltages VPP, VNN, in absolute value form, cannot be increased via the control gate switching circuit CGSW.

However, when the memory cells age, the erase cycles are less efficient at the same erase voltages than at the beginning of the life of the memory NVM.

This ageing phenomenon is typically caused by degradation of the floating gate oxide having been subjected to a large number of erase cycles, for example in the order of 500,000 cycles.

In this respect, the erasure circuitry is configured so as to increase the level of the positive erase voltage VYP according to the ageing of the memory cells.

For example, the writing circuitry or the erasure circuitry are configured so as to assess the wear value (AG) representative of the ageing of the memory cells by reading "in margin mode" in the memory cells after each application of erase stimuli. Reading in margin mode is a reading that measures, in a quantified manner, the threshold value of the floating-gate transistors TEsel. In such a case, the writing circuitry can be configured so as to implement a repetition of iterative erase cycles in a closed loop, until a correctly erased state is obtained.

Alternatively, the writing or erasure circuitry can assess the wear value representative of the ageing of the memory cells (AG, FIGS. 4 and 5) from a recording of the last value of the erase voltages VYP, VNN. More specifically, the writing or erasure circuitry can be automated so as to regularly measure the erased states "in margin mode", and increase, where necessary, the values of the erase voltages VYP, VNN. The new erase voltage values VYP, VNN are recorded and may be used as a reference for assessing the wear value AG during the next erase cycle.

The level of the positive erase voltage VYP can thus be increased according to the evolution of the wear value (AG).

Since the positive erase voltage VYP biases the well PW1 and does not transit via the control gate switching circuits CGSW, this positive erase voltage is not directly limited by the breakdown level (HVmax) of the bipolar junctions of said circuits CGSW.

Thus, the level of the positive erase voltage VYP can be greater than a breakdown level (HVmax) of the control gate switch CGSW. This allows the voltage conditions of the writing cycles to be intensified, when the ageing of the memory cells is such that the maximum levels of positive voltage (VPP) and negative voltage (VNN) of the control gate switching circuit CGSW are reached and are no longer sufficient to generate erased states that can be strictly discriminated from the programmed states.

Figure 4:
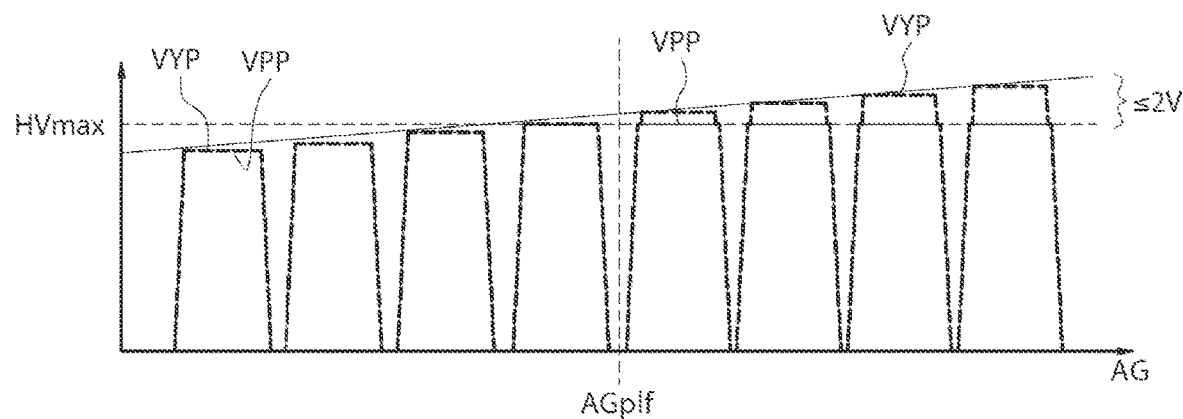
FIGS. 4 and 5 show two example embodiments of implementing a writing method in the memory NVM described with reference to FIGS. 1 to 3.
Figure 5:
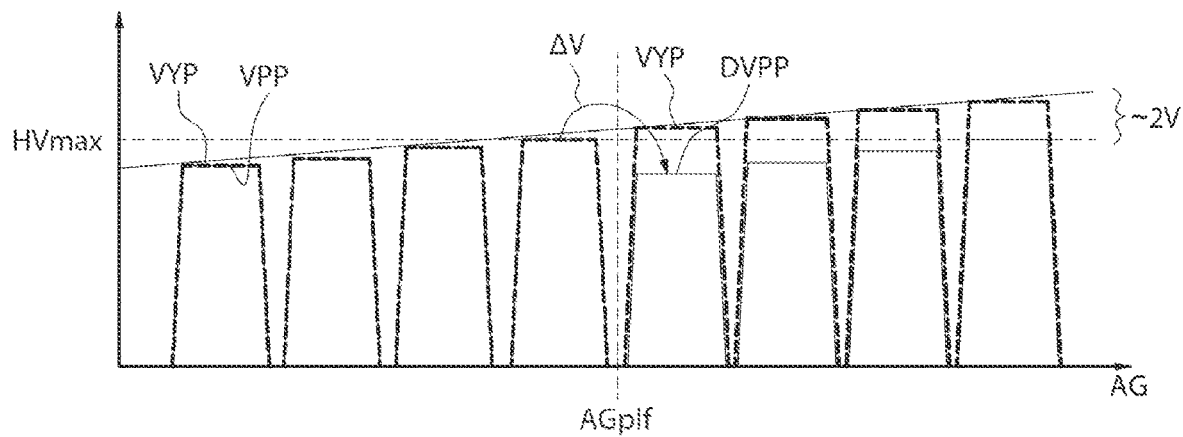

Reference is made, in this respect, to FIGS. 4 and 5.

FIGS. 4 and 5 show two examples of implementing the writing method in the memory NVM described hereinabove with reference to FIGS. 1 to 3.

FIGS. 4 and 5 show the evolution in the levels of the positive voltages implemented during erase cycles, the positive erase voltage VYP applied in the well PW1 and the neutralization voltage VPP applied in the control gates CG of the unselected state transistors TEnsel.

In both examples, the method comprises increasing the level of the positive erase voltage VYP resulting from the increase in the wear value AG representative of the ageing of the memory cells. As a result, the amplitude of the erase stimuli is increased to limit the drift in the threshold values of the aged memory cells, thus allowing the overall durability of the memory to be increased.

For example, the increase in the level of the positive erase voltage VYP results from the increase in the wear value AG in that they are proportional. The increase in the level of the positive erase voltage VYP can also be broken down into steps, the levels whereof increase proportionally with the increase in the wear value AG.

It should be remembered that the wear value AG can be obtained directly or derived from reading erased memory cells in margin mode.

The neutralization voltage VPP is configured relative to the positive erase voltage VYP so as to neutralize spurious erasure phenomena of the unselected memory cells TEnsel.

The neutralization voltage can be chosen such that it is equal to, or close to, the positive erase voltage VYP.

The method thus comprises increasing the level of the neutralization voltage VPP resulting from the increase in the level of the positive erase voltage VYP.

Although the neutralization voltage VPP and the positive erase voltage VYP are initially different, the neutralization voltage VPP is increased so as to keep the initial difference constant.

The neutralization voltage VPP is limited by the breakdown level of the control gate switch CGSW, since it is transmitted over the control gate lines of the unselected memory cells TEnsel.

Thus, in the example in FIG. 4, when the neutralization voltage VPP has increased until reaching the maximum level HVmax of the control gate switching circuit CGSW, the neutralization voltage VPP is set to this maximum level HVmax and no longer increases according to the wear value AG of the memory cells.

It goes without saying that the term maximum level is understood to mean a safety margin taken as regards the breakdown level of the bipolar junctions of the control gate switching circuit CGSW.

A threshold value AGplf of the wear value AG is defined (which will be referred to hereinafter as the "wear threshold value AGplf") as the wear value at which the positive erase voltage VYP and the neutralization voltage VPP reach the maximum level HVmax.

Beyond the wear threshold value AGplf, the level of the neutralization voltage VPP is no longer increased, but the level of the positive erase voltage VYP is still increased to levels exceeding the maximum level HVmax and to levels exceeding the breakdown level of the bipolar junctions of the control gate switching circuit CGSW.

Increasing the positive erase voltage VYP further results in increasing the wear value AG, in the same way as below the wear threshold value AGplf, proportionally to the increase in the wear value AG, optionally in steps.

Thus, above the wear threshold value AGplf, the deviation between the positive erase voltage VYP and the neutralization voltage VPP increases according to the increase in the wear AG of the memory cells. This generates spurious erasure phenomena, gradually increasing from the wear threshold value AGplf.

Methods exist for compensating for this type of spurious phenomenon, for example refresh algorithms.

The level of the positive erase voltage VYP is no longer increased when it is greater than a tolerance margin relative to said breakdown level HVmax of the control gate switch CGSW.

For example, the tolerance margin is chosen to be 2V, in particular in order to limit the spurious erasure phenomena and be able to easily compensate them using "refresh"-type methods.

In the example shown in FIG. 5, above the wear threshold value AGplf, the method comprises, on the one hand, offsetting ΔD the level of the neutralization voltage VPP to obtain an offset neutralization voltage DVPP, and on the other hand, increasing the level of the offset neutralization voltage DVPP, while keeping the offset ΔD (between the level of the offset neutralization voltage DVPP and the level of the positive erase voltage VYP) constant.

The level of the positive erase voltage VYP continues to increase, following the increase in the wear value AG.

Thus, as a result of the offset ΔD, the neutralization voltage VPP can also continue to follow the evolution of the positive erase voltage VYP without exceeding the maximum level HVmax.

Moreover, when the neutralization voltage VPP reaches, to the nearest safety margin, the level of the breakdown voltage HVmax of the control gate switch CGSW, the positive erase voltage VYP is no longer increased.

Keeping the offset ΔD constant when increasing the positive erase voltage VYP eases the regulation of the positive voltages VYP, VPP generated, and also allows the compensation of the spurious erasure phenomena generated by this constant difference to be easily controlled.

For example, the offset ΔD is set to substantially 2V in order to limit the spurious erasure phenomena and be able to easily compensate them using "refresh"-type methods.

For example, the positive erase voltage VYP and the positive neutralization voltage VPP are generated over the same output of a charging pump circuit (not shown), provided that said positive voltages VYP, VPP are equal, before having reached the wear threshold value AGplf. After having reached the wear threshold value AGplf, an additional charging pump stage can be coupled in parallel to provide, over a separate output, the positive erase voltage VYP that is then greater than the positive neutralization voltage VPP. Keeping the deviation ΔV between the positive erase voltage VYP and the positive neutralization voltage DVPP constant advantageously allows the regulation of said positive voltages VYP, DVPP to be pooled, at least over the charging pump stages common to the generations thereof.

Thus, in the two examples described hereinabove with reference to FIGS. 4 and 5, the method comprises increasing the level of the positive erase voltage VYP beyond the breakdown voltage HVmax, in order to continue to increase the amplitude of the erase stimuli to limit the drift in the threshold values of the aged memory cells, thus allowing the overall durability of the memory to be increased, well beyond the wear threshold value AGplf.

Figure 6:
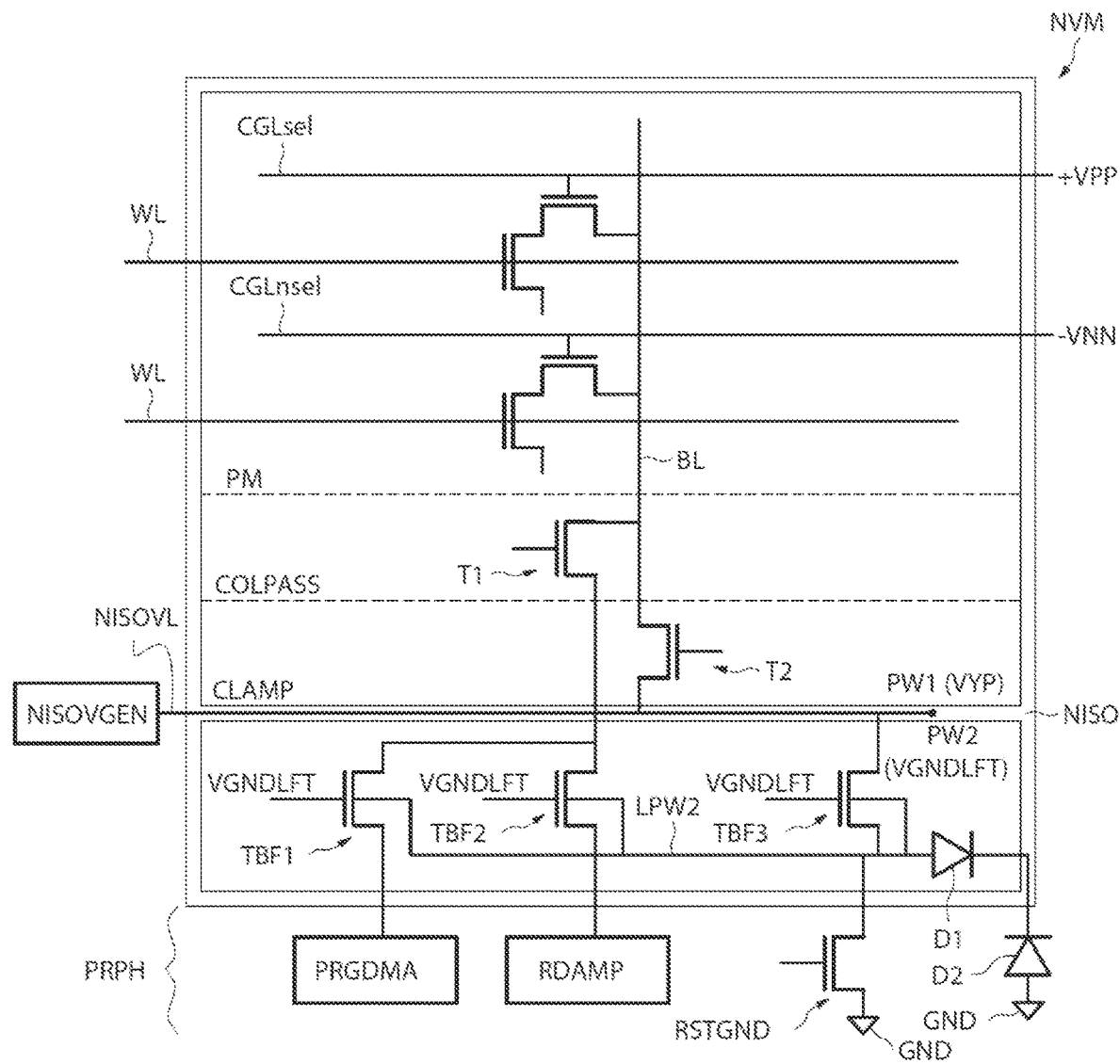
FIG. 6 shows an example embodiment of a memory.

FIG. 6 shows, in a comprehensive and overhead view, one advantageous example embodiment of the memory NVM as described hereinabove with reference to FIGS. 1 to 5. As illustrated in FIG. 6, the control circuitry includes, inter alia, a distribution circuit NISOVGEN.

The well PW1 houses the memory cells in a memory array PM, typically arranged in an array of rows and of columns. In particular, the control gate lines CGLi–CGLi+k in addition to the word lines WL extend row-wise in the memory array, whereas the bit lines BL and control gate decoding lines sent to the control gate switching circuit CGSW extend column-wise in the memory array PM.

The well PW1 further houses transistors T1 of a column decoder COLPASS in addition to transistors T2 of a grounding device CLAMP of the bit lines BL.

The semiconductor well PW1 housing the memory cells is isolated from the rest of the circuit by a structure of the "triple well" type, wherein a semiconductor isolation region NISO surrounds the well PW1.

The semiconductor isolation region NISO has an opposite conductivity to that of the well PW1 housing the memory array, and is biased with the same voltage as the well PW1 that it surrounds.

Isolation is produced by bipolar junctions that are the reverse of one another between the well PW1 and the isolation region NISO and between the isolation region NISO and the semiconductor substrate.

A bias line of the isolation regions NISOVL allows a biasing to be obtained in the isolation region NISO and in the well housing the memory cells PW1.

A distribution circuit NISOVGEN is configured so as to transmit the bias voltage, which is in particular capable of having the level of the positive erase voltage VYP during erase cycles. For example, the distribution circuit NISOVGEN includes a voltage step-up latching circuit. The voltage step-up latching circuit is configured so as to actuate the latch (for example, of the type with two head-to-tail inverters, the output of one looping to the input of the other) so as to provide a high output voltage level; and then to increase a low reference voltage so as to positively offset the output to the level of the positive erase voltage VYP.

Outside of the erase cycles, the bias line of the isolation region NISOVL is brought to a ground reference potential GND, in particular by means of a reset transistor RSTGND as described hereinbelow.

The conducting terminals of the transistors T2 of the grounding device CLAMP of the bit lines BL are coupled, on the one hand, to the bit lines BL of the memory array PM, and on the other hand to a bias line of the isolation region NISOVL. The transistors T2 of the grounding device CLAMP are used to carry the unused bit lines BL either at the ground potential GND present on the bias line of the isolation region NISOVL, or at high impedance HZ, so as to leave the bit lines BL at a floating potential.

The conducting terminals of the transistors T1 of the column decoder COLPASS are coupled, on the one hand, to the bit lines BL of the memory array PM, and on the other hand to devices of a peripheral circuit PRPH.

The peripheral circuit PRPH of the memory NVM in particular includes a programming and direct memory access circuit PRGDMA and a read-out circuit RDAMP.

The programming and direct memory access circuit PRGDMA is in particular used during programming cycles to selectively bias a decoded bit line BL. The read-out circuit RDAMP is configured so as to detect a voltage or current change over a bit line BL, representative of the state of a memory cell, the state transistor whereof is also controlled at a read voltage. The read-out circuit RDAMP can be capable of reading memory cells in margin mode.

The devices of the peripheral circuit PRPH are typically not capable of supporting voltages exceeding the maximum level HVmax described hereinabove with reference in particular to FIGS. 4 and 5.

However, in the bit lines BL, being left at a floating potential during erase cycles, the potential can rise to the level of the positive erase voltage VYP, to the nearest bipolar junction threshold value. As a result, the voltage present in the bit lines BL during erase cycles can rise to a level exceeding the breakdown level of the peripheral circuit PRPH.

Thus, a buffer semiconductor well PW2, of the same conductivity type as the well PW1 of the memory array PM, housing buffer transistors TBF1, TBF2, TBF3, is advantageously provided.

The buffer transistors TBF1, TBF2 are configured so as to protect the peripheral circuit PRPH from the possible high values of the level of the positive erase voltage VYP over the bit lines BL.

More specifically, on the one hand the bit lines BL are coupled to the peripheral circuit PRPH by way of the conducting terminals of the buffer transistors TBF1, TBF2, TBF3. In particular, the elements PRGDMA, RDAMP of the peripheral circuit PRPH are coupled to the sources of the buffer transistors TBF1, TBF2, whereas the bit lines BL are coupled to the drains of the buffer transistors TBF1, TBF2.

On the other hand, the buffer well PW2 and the gates of the buffer transistors TBF1-TBF3 are biased with a buffer isolation voltage VGNDLFT, for example generated by a buffer isolation control circuit.

The source of one of the buffer transistors, referred to as a buffer control transistor, TBF3, is coupled to a bias line LPW2 of the buffer well PW2. The biasing of the buffer well PW2 is thus controlled by the gate voltage VGNFLFT of the buffer control transistor TBF3.

A reset transistor RSTGND is moreover provided in the peripheral circuit PRPH to re-bias the buffer well PW2 and the bias line of the isolation region NISOVL with the ground reference potential GND, outside of the write cycles. The reset transistor RSTGND is blocked during the write cycles.

The buffer isolation voltage VGNDLFT is, for example, at least equal to the difference between the level of the positive erase voltage VYP and the breakdown level HVmax of the control gate switch CGSW.

Thus, given that the gates of the buffer transistors TBF1-TBF3 are biased with the buffer isolation voltage VGNDLFT, the peripheral circuit PRPH is protected from the positive erase voltage VYP present over the bit lines BL (to the nearest bipolar junction threshold voltage) during the erase cycles.

More specifically, given that the buffer transistors TBF1, TBF2, TBF3 are controlled with the buffer isolation voltage VGNDLFT over the gates thereof, the sources thereof cannot be biased above this buffer isolation voltage VGNDLFT.

Moreover, given that the buffer semiconductor well PW2 is also biased with the buffer isolation voltage VGNDLFT, the buffer transistors will not be damaged by the positive erase voltage VYP of the bit lines BL, as a result of the choice stipulated hereinabove of the level of the buffer isolation voltage VGNDLFT.

Moreover, the buffer isolation voltage VGNDLFT can advantageously originate from the distribution circuit NISOVGEN of the positive erase voltage VYP.

More specifically, in order to distribute the positive erase voltage VYP (which, it is recalled, can be greater than the breakdown voltage of the bipolar junctions of the circuit), the distribution circuit NISOVGEN is, for example, configured so as to actuate a latching circuit in order to provide a high output voltage level, initially equal to VPP=HVmax.

Then, the distribution circuit NISOVGEN increases a low reference voltage GND of the latch, by a voltage VGNDLFT, in order to positively offset the output (initially equal to VPP) by VGNDLFT until reaching the level of the positive erase voltage VYP, VPP+VGNDLFT=VYP, without breakdown of the junctions of the transistors of the latch.

In other words, according to one example embodiment and implementation, beyond the wear threshold value AGplf, said increase in the level of the positive erase voltage VYP can comprise offsetting VGNDLFT a low reference voltage GND in a step-up latch NISOVGEN, the output whereof has been locked at a high reference voltage VPP in order to offset the level of the output as far as the level of the positive erase voltage VYP, greater than said breakdown level HVmax of the bipolar junctions of the control gate switching circuit CGSW.

Moreover, the semiconductor well PW1 housing the memory cells and the buffer semiconductor well PW2 are both isolated from the rest of the circuit by structures of the "triple well" type, advantageously using the same semiconductor isolation region NISO to surround the two wells PW1, PW2.

Isolation is procured by two reverse bipolar junctions, represented by the diodes D1 and D2 coupled in series in opposite polarities.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
  erasing memory cells housed in a semiconductor well of a non-volatile memory, the memory cells each having a floating gate and a control gate, the erasing including biasing the semiconductor well with a first erase voltage having an absolute value greater than a breakdown voltage level of bipolar junctions of a control gate switching circuit of the memory, an absolute value of the first erase voltage being based on a comparison of a value of an indication of wear of the memory cells to a wear threshold value; and
  writing to one or more of the memory cells.

2. The method of claim 1, wherein the absolute value of the first erase voltage is increased in response to the comparison indicating the value of the indication of wear is greater than the wear threshold value.

3. The method according to claim 2 wherein the erasing comprises biasing the control gates of selected memory cells with a second erase voltage, using the control gate switching circuit.

4. The method according to claim 1, wherein,
the memory includes a peripheral circuit, and buffer transistors housed in a buffer semiconductor well;
the memory cells are coupled to the peripheral circuit by conducting terminals of the buffer transistors; and
the buffer semiconductor well and the gates of the buffer transistors are biased with a buffer isolation voltage to isolate the peripheral circuit from the first erase voltage.

5. The method according to claim 4, wherein, in response to the value of the indication of wear being less than the wear threshold value, the buffer isolation voltage is set at least equal to a difference between the level of the first erase voltage and the breakdown voltage level of the bipolar junctions of the control gate switching circuit.

6. The method according to claim 4, wherein a semiconductor isolation region is biased with the first erase voltage, the semiconductor isolation region surrounding the semiconductor well housing the memory cells and the buffer semiconductor well, the memory having a structure of a triple-well type.

7. The method according to claim 1, wherein the erase cycle comprises, via the control gate switching circuit, biasing the control gates of unselected memory cells with a neutralization voltage.

8. The method according to claim 7 wherein, in response to the value of the indication of wear being less than the wear threshold value, the level of the neutralization voltage is increased, in absolute value form, to keep a constant initial deviation relative to the level of the first erase voltage.

9. The method according to claim 7, wherein, in response to the value of the indication of wear being greater than the wear threshold value, the level of the neutralization voltage is offset to an offset neutralization voltage level, and the level of the offset neutralization voltage is increased, in absolute value form, to keep the offset constant relative to the level of the first erase voltage.

10. The method according to claim 9 wherein, in response to the value of the indication of wear being greater than the wear threshold value and the level of the neutralization voltage reaching the breakdown voltage level of the bipolar junctions of the control gate switching circuit, the level of the first erase voltage is maintained.

11. The method according to claim 1, wherein, in response to the value of the indication of wear being greater than the wear threshold value, the level of the first erase voltage is maintained at a level equal to a tolerance margin taken for the breakdown voltage level of the bipolar junctions of the control gate switching circuit.

12. A non-volatile memory integrated circuit, comprising:
memory cells housed in a semiconductor well, each memory cell including a state transistor having a floating gate and a control gate; and
control circuitry coupled to the memory cells, wherein the control circuitry, in operation, controls reading, writing and erasing of the memory cells, wherein the erasing includes biasing the semiconductor well with a first erase voltage having an absolute value greater than a breakdown voltage level of bipolar junctions of a control gate switching circuit of the non-volatile memory, an absolute value of the first erase voltage being based on a comparison of a value of an indication of wear of the memory cells to a wear threshold value.

13. The integrated circuit of claim 12, wherein the absolute value of the first erase voltage is increased in response to the comparison indicating the value of the indication of wear is greater than the wear threshold value.

14. The integrated circuit according to claim 12, wherein the control circuitry, in operation, biases the control gates of selected memory cells with a second erase voltage, using the control gate switching circuit.

15. The integrated circuit according to claim 12, including a peripheral circuit and buffer transistors housed in a buffer semiconductor well, wherein the memory cells are coupled to the peripheral circuit by conducting terminals of the buffer transistors, and the control circuitry, in operation, biases the buffer semiconductor well and the gates of the buffer transistors with a buffer isolation voltage to isolate the peripheral circuit from the first erase voltage.

16. The integrated circuit according to claim 15 wherein, in operation, when the value of the indication of wear is greater than the wear threshold value, the control circuitry generates the buffer isolation voltage at least equal to a difference between a level of the first erase voltage and the breakdown voltage level of the bipolar junctions of the control gate switching circuit.

17. The integrated circuit according to claim 15, wherein the semiconductor well housing the memory cells is surrounded by a semiconductor isolation region in a structure of triple well type, the buffer semiconductor well is surrounded by the semiconductor isolation region, and the control circuitry, in operation, biases the semiconductor isolation region with the first erase voltage.

18. The integrated circuit according to claim 12, wherein the control circuitry, during an erase cycle, biases control gates of unselected memory cells with a neutralization voltage, via the control gate switching circuit.

19. The integrated circuit according to claim 18, wherein during the erase cycle, when the value indicative of wear is less than the wear threshold value, the control circuitry sets a level of the neutralization voltage, in absolute value form, to keep a constant initial deviation relative to the level of the first erase voltage.

20. The integrated circuit according to claim 18, wherein during the erase cycle, when the value indicative of wear is greater than the wear threshold value, the control circuitry, in operation, offsets the level of the neutralization voltage to an offset neutralization voltage level, and to increase the level of the offset neutralization voltage, in absolute value form, so as to keep the offset constant relative to the level of the first erase voltage.

21. The integrated circuit according to claim 20, wherein, when the value indicative of wear is greater than the wear threshold value, the control circuitry maintains the level of the first erase voltage unchanged, when the level of the neutralization voltage reaches the breakdown level of the bipolar junctions of the control gate switching circuit.

22. The integrated circuit according to claim 12, wherein, when the value indicative of wear is greater than the wear threshold value, the control circuitry maintains the level of the first erase voltage unchanged, when the level of the first erase voltage is equal to a tolerance margin taken for the breakdown level of the bipolar junctions of the control gate switching circuit.

23. A system, comprising:
one or more processing cores; and
a non-volatile memory coupled to the one or more processing cores, the non-volatile memory including:
memory cells housed in a semiconductor well, each memory cell including a state transistor having a floating gate and a control gate; and
control circuitry, which, in operation, controls reading, writing and erasing of the memory cells, wherein the erasing includes biasing the semiconductor well with a first erase voltage having an absolute value greater than a breakdown voltage level of bipolar junctions of a control gate switching circuit of the non-volatile memory, an absolute value of the first erase voltage being based on a comparison of a value of an indication of wear of the memory cells to a wear threshold value.

24. The system of claim 23, comprising an integrated circuit including the non-volatile memory.

25. The system of claim 24 wherein the integrated circuit includes the one or more processing cores.

26. The system of claim 23, wherein the absolute value of the first erase voltage is increased in response to the comparison indicating the value of the indication of wear is greater than the wear threshold value.

27. The system of claim 23, wherein the control circuitry, during an erase cycle, biases control gates of unselected memory cells with a neutralization voltage, via the control gate switching circuit.

* * * * *